(12) United States Patent
Aliahmad et al.

(10) Patent No.: US 6,874,097 B1
(45) Date of Patent: Mar. 29, 2005

(54) TIMING SKEW COMPENSATION TECHNIQUE FOR PARALLEL DATA CHANNELS

(75) Inventors: Mehran Aliahmad, Ottawa (CA); Russell W Brown, Nepean (CA); Bruce Leshay, West Boylston, MA (US)

(73) Assignee: Maxtor Corporation, Longmont, CO (US)

( * ) Notice: Subject to any disclaimer, the term of this patent is extended or adjusted under 35 U.S.C. 154(b) by 840 days.

(21) Appl. No.: 09/870,704

(22) Filed: Jun. 1, 2001

(51) Int. Cl.[7] ............................................. G06F 1/12
(52) U.S. Cl. ...................................... 713/401; 375/355
(58) Field of Search .......................... 713/401; 375/355

(56) References Cited

U.S. PATENT DOCUMENTS

| | | | | |
|---|---|---|---|---|
| 5,467,464 A | * | 11/1995 | Oprescu et al. | 713/400 |
| 5,968,180 A | * | 10/1999 | Baco | 713/400 |
| 6,031,847 A | * | 2/2000 | Collins et al. | 370/508 |
| 6,553,505 B1 | * | 4/2003 | Brown et al. | 713/401 |

OTHER PUBLICATIONS

SCSI Trade Association, "Ultra320 SCSI : New Technology—Still SCSI", Mar. 2001.*

* cited by examiner

Primary Examiner—Thomas Lee
Assistant Examiner—Albert Wang
(74) Attorney, Agent, or Firm—Myers Bigel Sibley & Sajovec

(57) ABSTRACT

A method and apparatus for correcting the timing skew of data signals in a parallel data transmission system, such as Small Computer System Interface (SCSI) data bus, relative to a receive clock in the data bus. The system separately corrects the receive clock duty cycle, and also features independent de-skewing of the rising and falling edges of a data waveform to improve timing accuracy of transmitted signals. The method and apparatus can be used without substantial changes to existing transmission system protocols, and can be implemented on an all-digital integrated circuit.

45 Claims, 10 Drawing Sheets

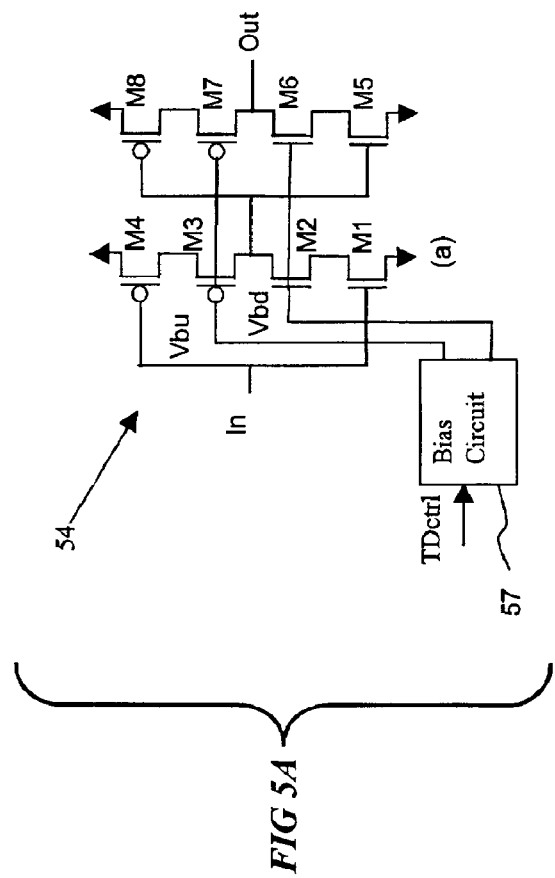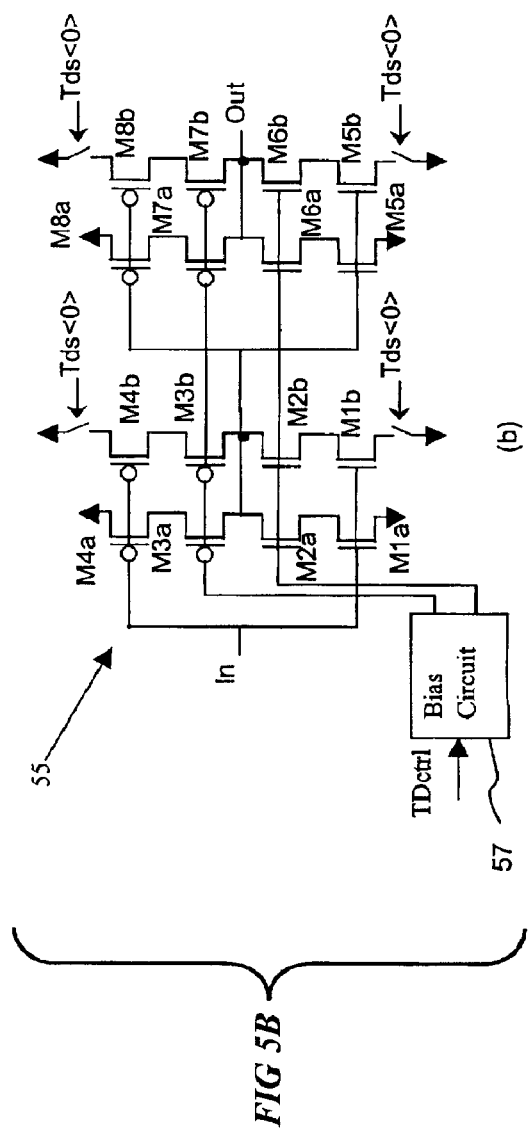
FIG 5A
FIG 5B

| Tdf<2>,Tdf<1>,Tdf<0> | Falling Edge Delay |
|---|---|
| 0,0,0 | 3Td |
| 0,0,1 | 3Td+Δt |
| 0,1,0 | 3Td+2Δt |
| 0,1,1 | 3Td+3Δt |
| 1,0,0 | 3Td+4Δt |
| 1,0,1 | 3Td+5Δt |
| 1,1,0 | 3Td+6Δt |
| 1,1,1 | 3Td+7Δt |

*FIG 8*

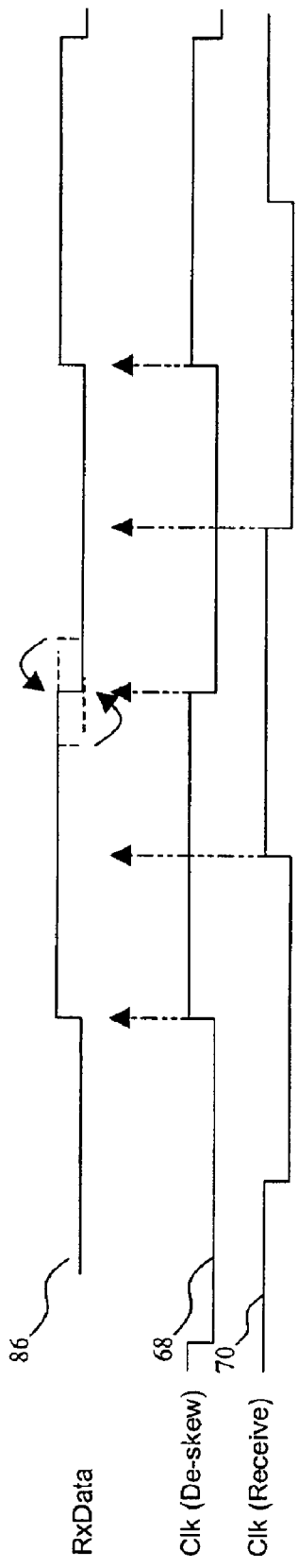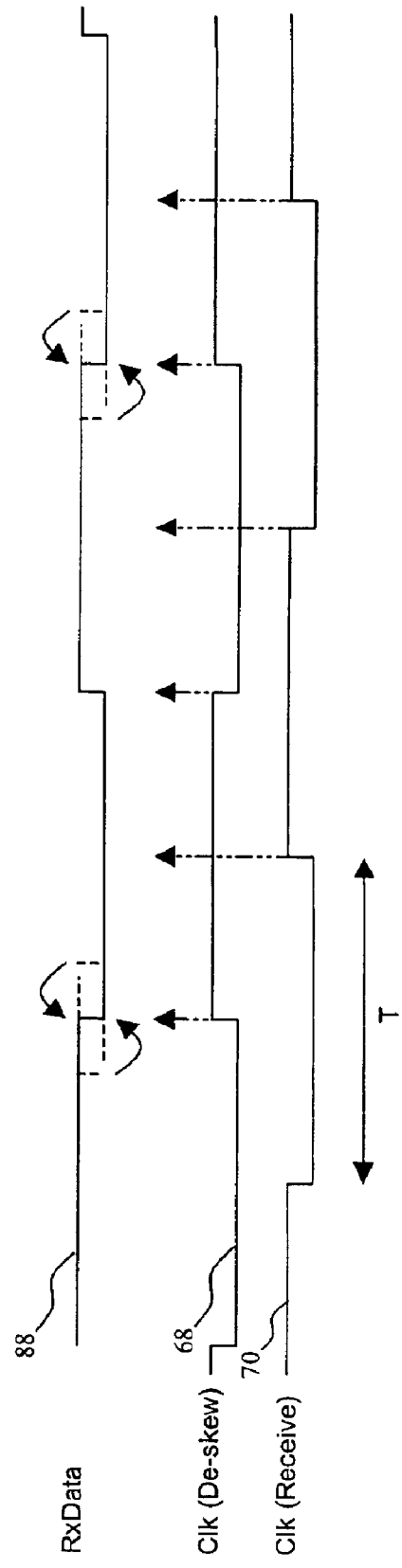

TIMING SKEW COMPENSATION TECHNIQUE FOR PARALLEL DATA CHANNELS

BACKGROUND OF THE INVENTION

1. Reservation of Copyright

This patent document contains information subject to copyright protection. The copyright owner has no objection to the facsimile reproduction by anyone of the patent document or the patent, as it appears in the U.S. Patent and Trademark Office files or records, but otherwise reserves all copyright rights whatsoever.

2. Field of the Invention

The invention-relates generally to apparatus and methods for adjusting the timing of a data signal relative to a reference signal, and more specifically to an apparatus and method for de-skewing the timing of a data signal in a data transmission system having multiple parallel data channels.

3. Description of Related Art

Parallel data bus systems, such as Small Computer System Interface (SCSI) data bus systems, are widely used in personal computers. These systems are used to transmit data to and from computer peripherals, such as hard disk drives, and act as the interface between the computer's main processing components and the peripherals, controlling which peripheral devices receive data and in what order. Consequently, the performance and reliability of the data bus system are critical to the overall performance of the computer.

In a parallel data bus system, differences in the electrical lengths of the connections between the data bus and the peripherals cause the signals from the peripherals to be time-skewed, each arriving at the receive end at a slightly different time. This timing skew becomes more problematic as the data transmission rate of the data bus is increased.

Data is usually transmitted in the bus in the form of a continuous square wave, in which a rise or fall in the wave's amplitude signifies the start of a new bit of data. Because the data is transmitted as a continuous wave, the data bus allocates a specific amount of time (i.e., a defined portion of the continuous wave of data) for the transmission of one bit of data. This time period is called the bit-cell time, and is a defining characteristic of the parallel data bus system.

As the data transmission rate of the parallel bus system is increased, the bit cell time commensurately decreases. For instance, in current implementations of the Small Computer System Interface (SCSI) parallel data bus, the bit-cell time is 12.5 nanoseconds (ns) and the maximum timing skew due to differences in electrical path lengths is ±3.75 ns (7.5 ns peak-to-peak). Thus, in current SCSI implementations, the maximum timing skew is a fraction of the bit cell time, and is therefore only a minor problem. However, the problem of timing skew becomes more pronounced as the speed of the bus is increased. In faster, next-generation SCSI bus implementations, the bit-cell time may be 6.25 ns, with the same timing skew of 7.5 ns peak-to-peak. Consequently, time-skewed data bits in next-generation parallel data bus systems may be lost, thus reducing the reliability of the data bus.

SUMMARY OF THE INVENTION

The present invention provides a method and an apparatus for de-skewing received data in a parallel data transmission system, or one or more components thereof. The parallel data transmission system has a clock path and at least one data path.

The apparatus comprises a local accurate reference clock for generating a tuning signal according to the bit-cell time of the data signal. A clock path is provided for adjusting the timing of the receive clock in accordance with the tuning signal. The clock path is selectively switchable between a timing skew correction mode and a receive-data mode.

A data path in parallel with the clock path is included in the apparatus. The data path comprises a delay digital-to-analog converter (DAC), a falling edge DAC, at least two receive registers, an output multiplexer, and control logic. The control logic detects the timing skew of at least one data signal and controls the delay DAC and the falling edge DAC to provide appropriate delay to the data signal. The delay DAC delays the data signal according to the tuning signal and instructions from the control logic. The falling edge DAC adjusts the timing of the falling edges of the data signal according to the tuning signal and instructions from the control logic. The receive registers capture data on both the rising and falling edges of the receive clock. If necessary, the output multiplexer swaps the outputs of the receive registers according to instructions from the control logic.

The method and apparatus of the present invention can be implemented without substantial modifications to existing parallel data bus protocols (e.g. SCSI) and is contained within the receiver circuitry of the data bus. As such, the method and apparatus can operate substantially without requiring feedback to the transmitter. The apparatus of the present invention is particularly advantageous if implemented as a digital integrated circuit.

BRIEF DESCRIPTION OF THE DRAWINGS

The above and other objects, features and advantages of the present invention are further described in the detailed description which follows, with reference to the drawings, and by of a non-limiting exemplary embodiment of the present invention, wherein like reference numerals represent similar parts of the present invention throughout the several views and wherein:

FIG. 5A is a schematic of a circuit implementation of a first delay cell of the delay DAC of FIG. 4;

FIG. 5B is a schematic of a circuit implementation of a second delay cell of the delay DAC of FIG. 4;

FIG. 8 is a table illustrating the various potential falling edge delay values using a falling edge DAC according to the present invention;

FIG. 9A is a comparative waveform illustration showing the potential effect of the falling edge DAC according to the present invention when data is early;

FIG. 9B is a comparative waveform illustration showing the potential effect of the falling edge DAC according to the present invention when data is late;

DETAILED DESCRIPTION

Figure 1:
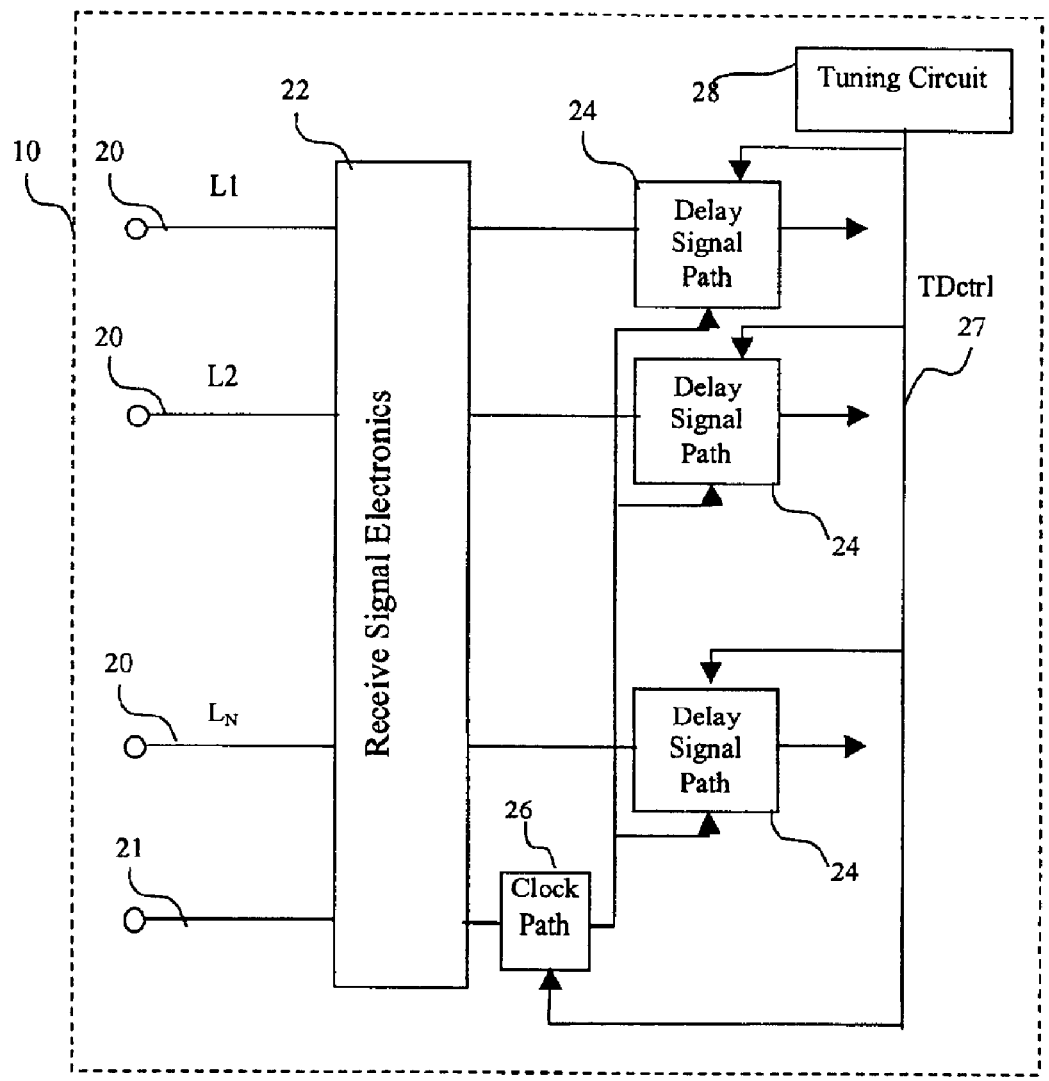
FIG. 1 is a schematic view of the receive side of a parallel data bus according to the present invention.

Referring now more particularly to the drawings, FIG. 1 is a schematic of the receive-side of a parallel data bus, indicated generally at 10. In this schematic, the data bus 10 consists of a plurality of individual data lines 20 (labeled $L_1$–$L_n$) supplying data in parallel and a clock line 21. Each individual data line 20 carries the data to or from a computer peripheral device, such as a hard disk drive.

Although the methods and functions of the present invention are applicable to any parallel data bus system, the embodiments will be described particularly as they apply to the Small Computer System Interface (SCSI) data bus. It is to be understood that reference to this particular type of data bus is intended for exemplary purposes only, and is not intended to limit the scope of the present invention.

In a SCSI data bus, there are typically seventeen data lines 20, sixteen individual data lines 20 and one parity (error-detection) line 20, each individual data line 20 operating in parallel with the others. There is also one clock line 21 which carries the timing information of the transmitted data. Data from individual data lines 20 and clock line 21 is received by the receive signal electronics 22. The receive signal electronics 22 may perform a variety of functions on the incoming analog data signals, including, for example, filtering and amplification.

Figure 2:
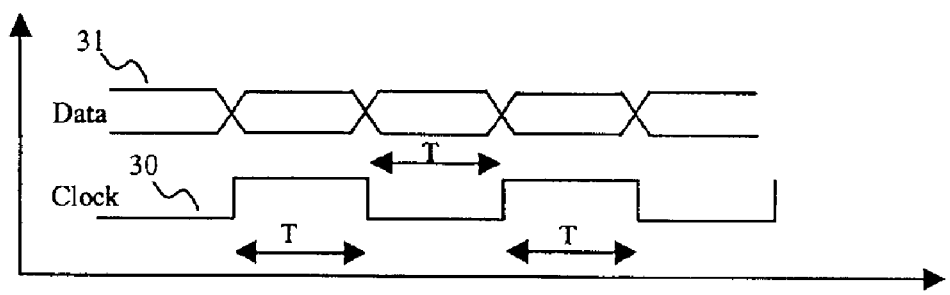
FIG. 2 is an illustration of typical data and clock waveforms in the parallel data bus of FIG. 1.

FIG. 2 illustrates exemplary data signals 31 and clock signals 30 that are transmitted on the individual data lines 20 and clock lines 21 of FIG. 1. The fundamental measure of time in the data bus 10 is the bit-cell time, T, the amount of time allocated for a portion of a data signal 31 representing one bit of data. All data signals 31 are transmitted aligned with the square wave clock signal 30. However, due to the different electrical path lengths of the various lines 20, 21, data signals 31 are received by the receive signal electronics 22 at slightly different times, resulting in a timing skew between the edges of the data bits in the data signals 31 and the edges of the clock signal 30. This timing skew is to be corrected, i.e. de-skewed, before the data transmitted by the individual data lines 20 is used. After de-skewing, data is captured at the center of the bit-cell to allow a maximum timing margin from transitions. This centered data capture operation is performed by time-shifting the clock signal 30 by half a bit-cell time, T/2, and using its edges to sample data.

In the embodiment of FIG. 1, the timing de-skew operation is performed by delay signal paths 24 that are disposed in the individual data lines 20. The receive side of the bus 10 has a clock path 26, which corrects the duty-cycle of the clock pulse and provides the T/2 time-shift for normal receive data operation. A tuning circuit 28 is also included to provide a tuning signal, TDctrl 27, for calibrating all the timing circuitry in the clock path 26, as well as the delay signal paths 24.

Figures 3A, 3B:
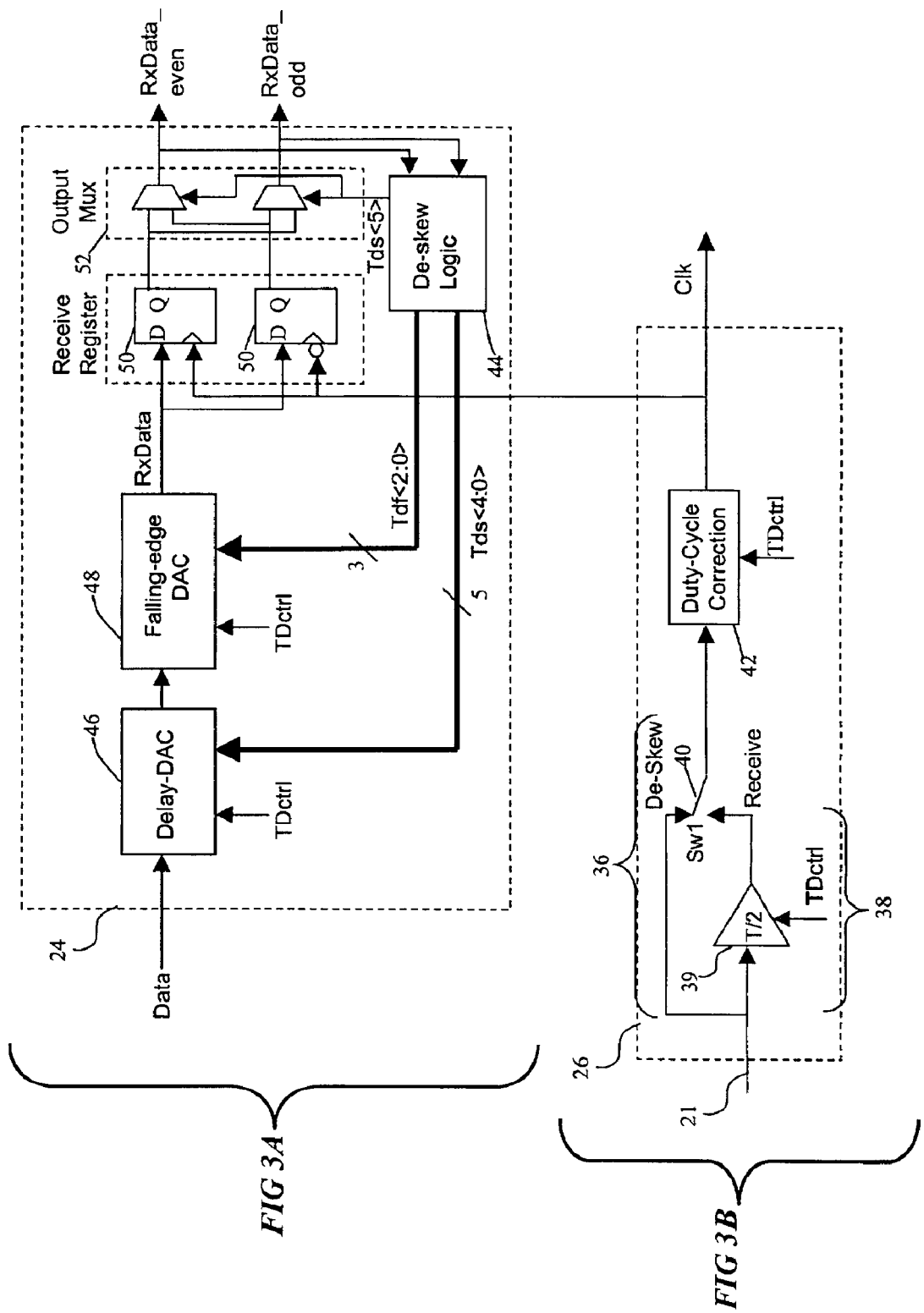
FIG. 3A is a schematic view of a delay signal path according to the present invention.
FIG. 3B is a schematic of a clock path according to the present invention.

The components of the de-skew system are shown in more detail in FIG. 3. FIG. 3A is a schematic diagram of the delay signal path 24. This block contains the necessary circuitry for time de-skewing of data signals in the individual data lines 20. The delay signal path 24 realigns the incoming data in each of the respective data lines 20 with the receive clock signal in a feedback loop controlled by the de-skew logic 44. In addition to the de-skew logic 44, the other major components of the delay signal path 24 are the delay digital-to-analog converter (DAC) 46, the falling-edge DAC 48, the receive registers 50 and the output multiplexer 52. The functions of each of these components 46, 48, 50, 52 will be explained below.

Figure 4:
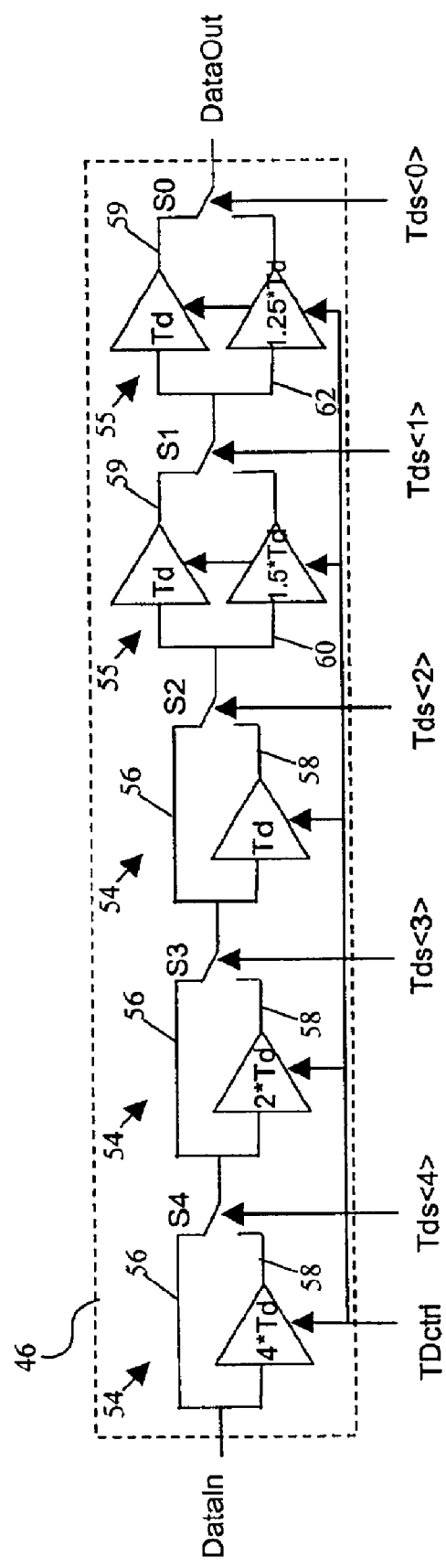
FIG. 4 is a schematic diagram of a delay digital-to-analog converter (DAC) according to the present invention.

The delay DAC 46 is a variable delay circuit that delays the incoming data signal in accordance with the de-skew logic 44. Its construction is illustrated in FIG. 4. In this embodiment, the delay is controlled by 5 bits which may be different for other applications. As shown in FIG. 4, the delay DAC 46 comprises five individual delay cells 54, 55, in a binary-weighted arrangement. Each cell 54 has a fixed delay, related to a standard delay value Td, which is tuned according to the tuning signal TDctrl. The arrangement of the delay cells 54, 55 provides an incremental delay to the incoming data signal. Together, the delay cells can vary the delay by up to 7.75 Td in steps of Td/4.

There are two possible data paths in each delay cell 54. A first data path 56 adds no delay to the incoming data signal. A second data path 58 adds a delay to the incoming signal. Incoming data in each cell is switched into one of these two paths by a control bit Tds<4>, Tds<3>, Tds<2> belonging to a control bus Tds<4:0>. The values of the control bits Tds<4>, Tds< >, Tds<2> of the bus Tds<4:0> are set by the de-skew logic 44, as is shown in FIG. 3A.

The standard delay value Td cannot be made arbitrarily small because of practical limitations in circuit speed. Therefore, in order to achieve a finer delay resolution in the delay DAC 46, the least significant bits of the delay DAC 46, that is, the delay cells 55 that are controlled by control bits Tds<1> and Tds<0>, include two delay paths, a first delay path 59 with a delay value of Td, and second delay paths 60, 62 with delay values of 1.5*Td and 1.25*Td, respectively. The dual delay paths 60, 62 of the last two delay cells 55 may also be implemented in a single delay cell with multiple data paths.

FIGS. 5A and 5B illustrate exemplary circuit implementations of the delay cells 54, 55. As shown, the delay cells are inverter stages M1, M4 with controlled current sources M2, M3. Bias circuits 57 use the tuning control voltage TDctrl to generate the bias of the current source transistors Vbd and Vbu to control the delay.

Figure 6A:
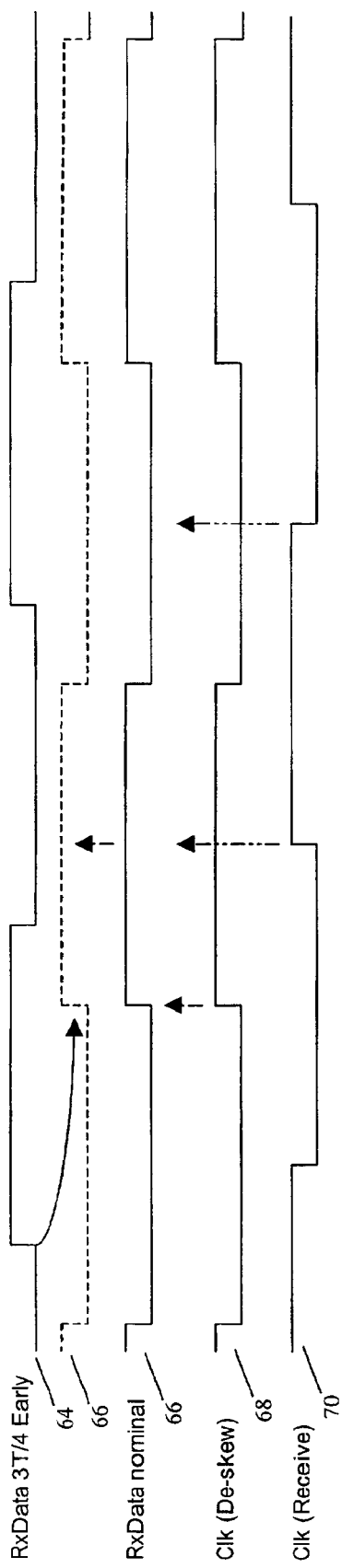
FIG. 6A is a comparative waveform illustration showing the effect of the delay DAC according to the present invention on data arriving early.
Figure 6B:
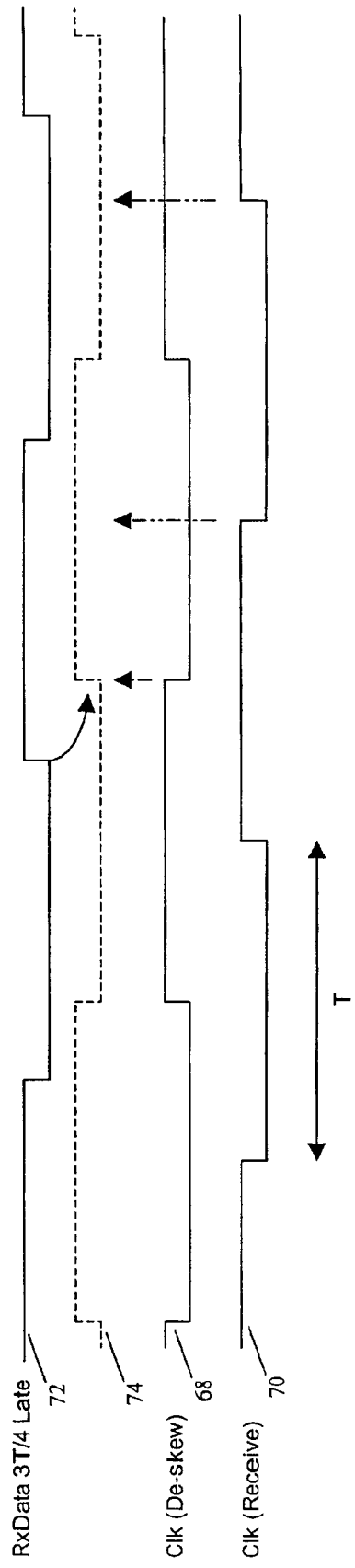
FIG. 6B is a comparative waveform illustration showing the effect of the delay DAC according to the present invention on data arriving late.

FIGS. 6A and 6B illustrate the effect of the delay DAC 46 on exemplary data waveforms of data in the parallel data bus 10. Ideally, the received data waveform 66 and the clock waveform 68 should be aligned; however, this is typically not the case. FIG. 6A illustrates the situation where the received data waveform 64 is ¾T earlier than the nominal case 66. Using a feedback loop, the de-skew logic 44 adjusts the delay provided by the delay DAC 46 to introduce a delay of ¾T into the data path 20. This delay aligns the rising edge of the data waveform 66 with the rising edge of the clock waveform 68.

Once the data waveform 66 is properly aligned with the clock waveform 68, the parallel data bus 10 uses a normal data-receive mode. In this normal data-receive mode, a time-shifted version of the clock waveform 70 is used to capture data at the center of bit-cell, as shown in FIG. 6A by vertical arrows.

FIG. 6B illustrates a data waveform 72 that arrives ¾T later than the nominal waveform 66. Because data cannot be shifted-back in time, in this case the delay DAC 46 introduces a delay of ¼T to align the rising edge of the data waveform 72 with the falling edge of the clock waveform 68. Note that the addition of a ¼T delay means that the data waveform 72 has been delayed by one full bit cell time T. If the clock waveform 68 were inverted, this case would become exactly the same as FIG. 6A. Instead of inverting the clock waveform 68, the receive registers 50 (FIG. 3A) are swapped in the output mux 52 by the control bit Tds<5>. Vertical arrows in FIG. 6B extending from the receive mode clock signal 70 illustrate where the data waveform 72 is sampled to capture bit values during normal data-receive operations.

Although the action of the delay DAC 46 aligns the rising edge of the data waveform 64 with the clock waveform 68, the falling edges of the data waveform 64 may still remain skewed with respect to the falling edges of the clock waveform 68. This may occur, for example, when the rise and fall delays are not equal in the parallel data bus system 10. Therefore, the falling edges of the data waveform 64 may need to be independently and separately de-skewed. The falling edge DAC 48, which is a three bit (i.e., three stages, FIG. 7) de-skewing circuit in this embodiment, performs an independent de-skewing operation on the falling edges of a data waveform 86 (FIG. 9A). The actual number of bits (i.e., stages) that comprise the falling edge DAC 48 may vary from implementation to implementation.

Figure 7:
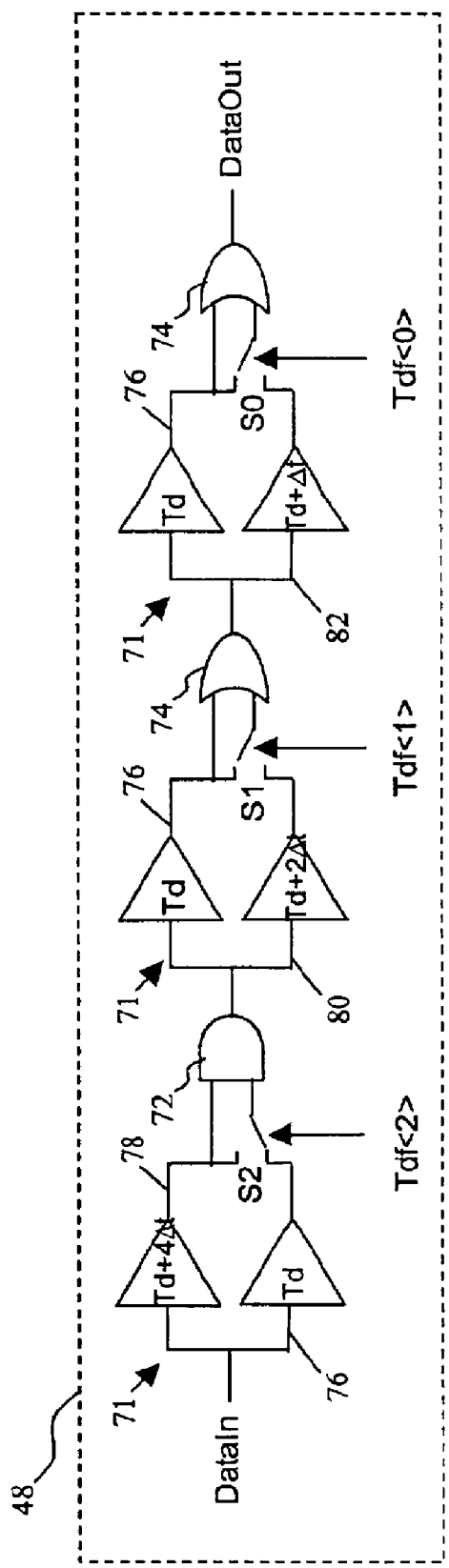
FIG. 7 is a schematic diagram of a falling edge DAC according to the present invention.

As shown in FIG. 7, each stage 71 of the falling edge DAC 48 includes two parallel signal paths 76, 78, 80, 82 that are mixed at the output by an AND gate 72 or an OR gate 74. In each of these stages 71, the top signal path affects the rising edges of a data waveform, and the lower signal path affects the falling edges of a data waveform. The falling edge DAC 48 is controlled by a three-bit control bus Tdf<2:0> (as also shown in FIG. 3A), having control bits Tdf<2>, Tdf<1>, and Tdf<0>. The values of the control bits Tdf<2>, Tdf<1>, Tdf<0> are set by the de-skew logic 44. When a control bit Tdf<2>, Tdf<1>, Tdf<0> is set to zero, both the rising and falling edges of a data waveform travel through the upper parallel signal path of the stage, thus, both the rising and falling edges of the data waveform are given the same delay. If a control bit Tdf<2>, Tdf<1>, Tdf<0> is set to one, the falling edges of the data waveform pass through the lower delay path of the stage, and are delayed separately from the rising edges of the data waveform.

Using the scheme of FIG. 7, the falling edges of a data waveform can be de-skewed without-changing the delay of the rising edges of that data waveform. The time delay of the rising edges is always 3Td+4Δt, but the time delay given to the falling edges of data varies with the values of the control bits Tdf<2>, Tdf<1>, Tdf<0>. FIG. 8 is a table which illustrates the various possible values of the control bits Tdf<2>, Tdf<1>, Tdf<0> and the corresponding delay values given to the falling edges of a data waveform. In FIG. 8, Td and Δt are both arbitrary delay constants. Note that the delay values presented in this discussion and in FIG. 8 neglect delays introduced by the various switches and gates in the delay DAC 48.

FIGS. 9A and 9B illustrate the effect of the falling edge DAC 48 on exemplary data waveforms 86, 88 in the parallel data bus 10. These figures are similar to FIGS. 6A and 6B. In FIG. 9A, the rising edges of a skewed waveform 86 have been substantially aligned with the rising edges of the de-skew clock signal 68 by the delay DAC 46, but the falling edge of the data waveform 86 has a timing skew relative to the clock signal 68. As is shown by the arrows and dotted lines, the falling edge DAC moves this edge into alignment with the falling edge of the de-skew clock signal 68.

In FIG. 9B, the rising edges of the data waveform 88 have been substantially de-skewed by the delay DAC 44 and aligned with the falling edges of the clock signal 68. However, the falling edge of the data waveform 88 has a timing skew relative to the clock signal 68. As is shown by the arrows and dotted lines, the falling edge DAC 48 moves this edge into alignment with the rising edge of the de-skew clock signal 68. Both FIGS. 9A and 9B also illustrate the clock signal in normal data-receive mode 70. Arrows extending from the normal data-receive mode clock signal 70 illustrate where the data waveform 88 is sampled to capture bit values.

Figure 10:
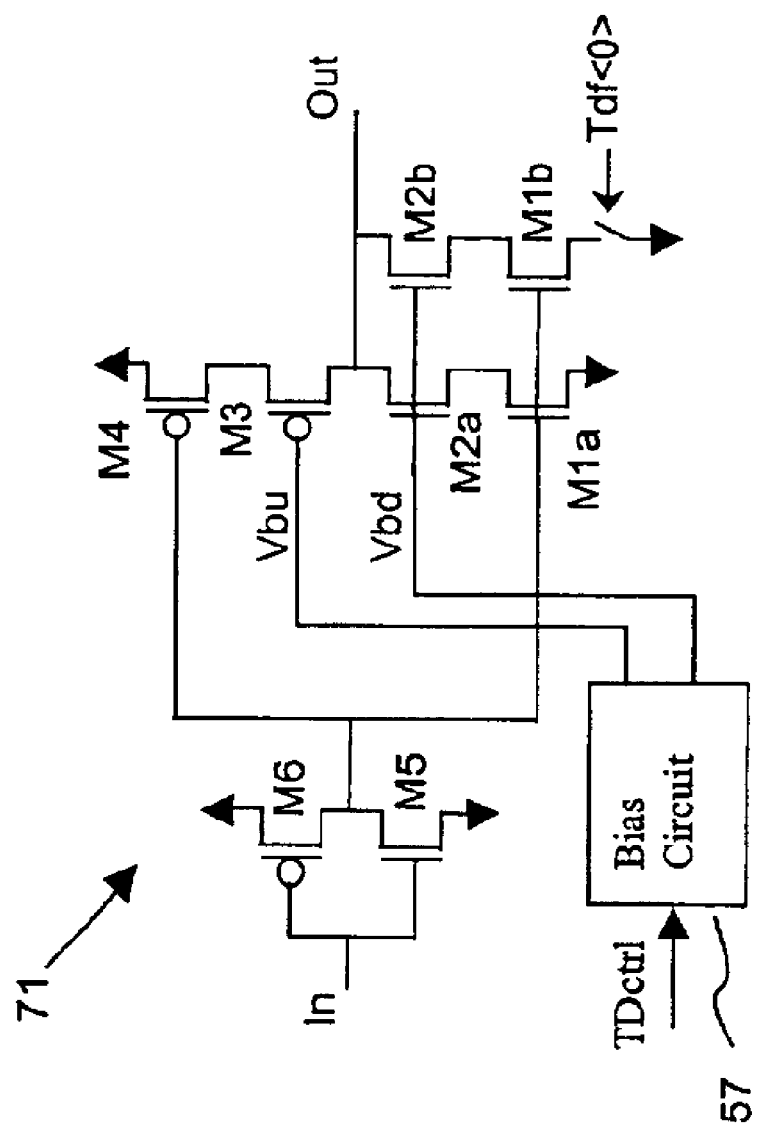
FIG. 10 is a schematic of a circuit implementation of a delay cell of the falling edge DAC of FIG. 7.

It should be understood that the stages of the falling edge DAC 48 may be implemented in a variety of ways. One possible implementation of the stages of the falling edge DAC 48 is illustrated in FIG. 10. This implementation is similar to that of a cell 71 of the delay DAC 46, except that only the lower devices M2b and M1b that affect the falling edges of the signal are split.

The receive registers 50 of FIG. 3A contain two D-type flip-flops, which are used to capture received data on both the rising edges of the receive clock signal 68 and falling edges of the receive clock signal 68.

The output multiplexer 52 is provided to swap the outputs of the two registers 50 if data is late with respect to the rising clock edge. This is achieved by setting the control bit Tds<5> to one. This scheme allows capturing data at the opposite clock edges which is effectively the same as shifting the clock by one T. In other words, the effective time de-skewing range of the delay signal path 24 is extended to 2T with this technique. Therefore Tds<5> can be considered as the $6^{th}$ bit of the delay DAC 46, resulting in a 6 bit (64 steps) overall delay resolution.

FIG. 3B shows the components of the clock path 26. This circuit includes a switch 40 which selects the receive clock signal 68 for time de-skewing operations or a delayed version 70 of the receive clock signal 68 for normal data-receive operations. A delay element 39 introduces a delay of T/2 into the receive clock signal, allowing data to be captured at the center of bit-cell. This delay is accurately controlled by the tuning signal TDctrl. The effect of this delay in the clock signal 70 is illustrated in FIGS. 6A and 6B, in which waveform 68 represents the output clk in de-skew mode 36 (indicated as "Clk (de-skew)" in FIGS. 6A–B) and waveform 70 represents the output clock in the receive mode (indicated as "Clk (Receive)" in FIGS. 6A–B.

In both modes of operation, the receive clock has its duty cycle corrected by a duty-cycle correction circuitry 42. This circuit removes any residual duty-cycle error on the clock signal and ensures that the receive clock signal that is used for time de-skewing operations has a 50% duty-cycle (i.e. its pulse width is exactly equal to T).

Figure 3C:
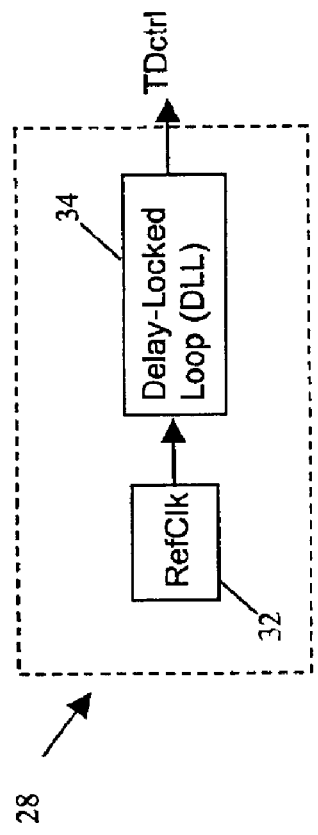
FIG. 3C is a schematic of a tuning circuit according to the present invention.

Using an accurate local reference clock 32 of FIG. 3C, a tuning signal TDctrl is generated to properly tune all of the delay elements of the circuit. This tuning ensures that each of the timing and delay elements produces a controlled timing or delay, and compensates for the effect of temperature variations or process variations in the manufacture of the circuit elements.

As shown in FIG. 3C, the tuning circuit 28 includes a reference clock 32 connected to a delay-locked loop 34. The reference clock 32 may be a local accurate clock outside of the data bus 10, for example, an independent crystal oscillator with a fixed frequency. The delay-locked loop 34 may be comprised of delay elements similar to those used in other parts of this illustrated embodiment. The delay-locked loop 34 produces a precise TDctrl control signal by adjusting the TDctrl signal in a feedback loop according to the timing of the reference clock. This delay control signal TDctrl is then used in all other delay elements in the system to match their delay to that of the delay elements in the delay-locked loop 34.

Figure 11:
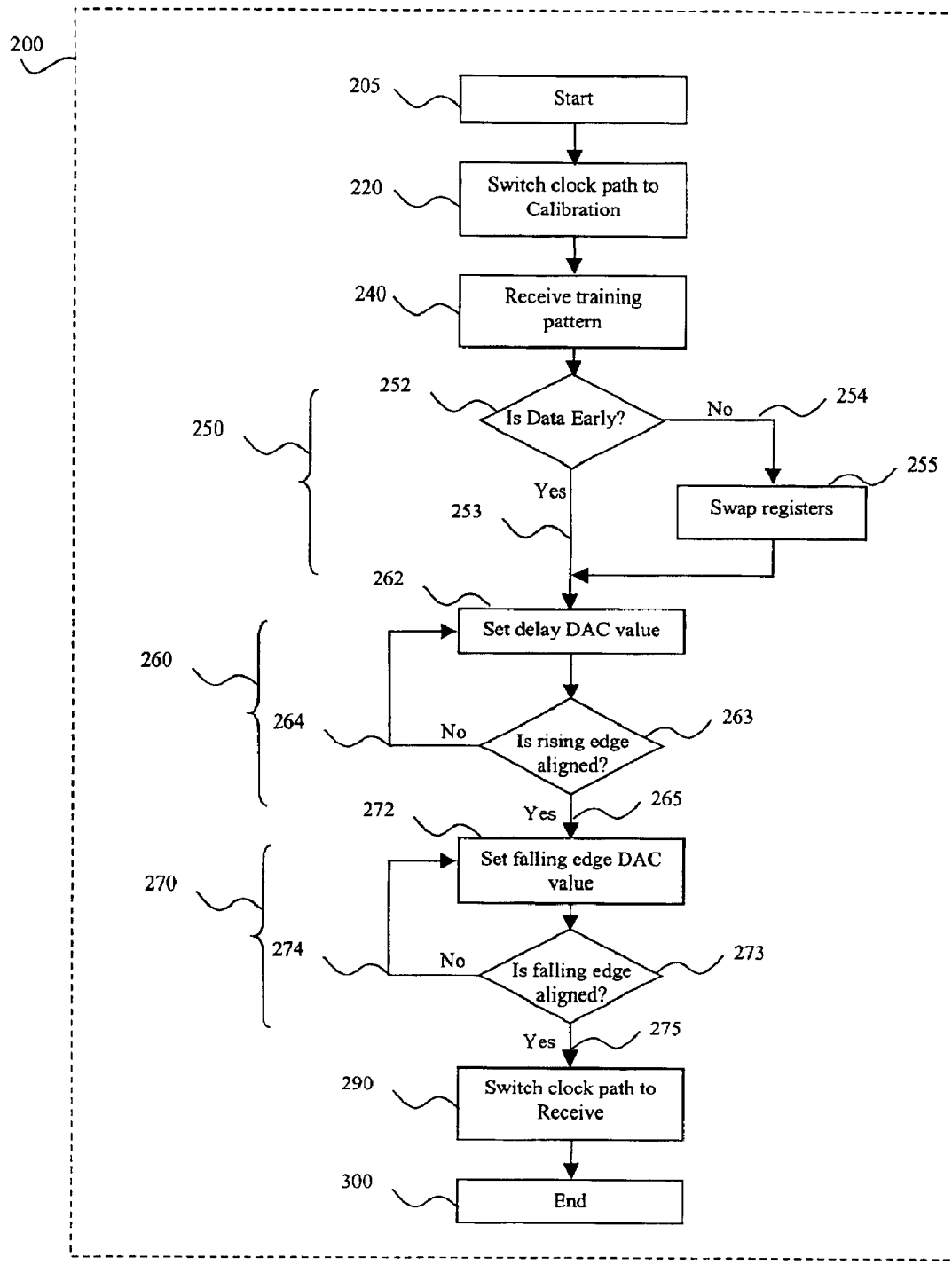
FIG. 11 is a flow chart diagram illustrating the blocks of a process according to the present invention.

FIG. 11 depicts process 200 for de-skewing received data in a parallel data transmission system, such as a SCSI data bus. The reference clock 32 and delay locked loop 34 are operational all the time and continuously control all delay elements in the system through TDctrl. The de-skewing process begins at block 205. In block 220, the switch Sw1 40 is switched into the deskew position (thus bypassing the T/2 delay of the receive signal clock path 38). In block 240, a training pattern (e.g. 101010) is transmitted and received by the delay signal path 24. Control then passes to block 250, where the de-skew logic 44 determines whether data is early or late with respect to the rising edge of clock. If it is late, the outputs of the receive registers 50 are swapped in block 255 by setting bit Tds<5>.

The feedback decision loop for the delay DAC 46 is illustrated in block 260. With the delay DAC 46 set to minimum delay, the de-skew logic 44 tests the value of the RxData_even from output mux 52. If the RxData_even gives a "hi" result, the de-skew logic 44 makes the determination that the data is early and more delay is needed in the delay DAC 46. In that case, the de-skew logic 44 proceeds to increment the delay of the delay DAC 46 by setting the values of the control bits Tds<4>, Tds< >, Tds<2>, Tds<1>, Tds<0>, for example, using a binary search method. As shown at 263 and 264, control of the process is returned to block 262 until the smallest delay value that aligns the training-pattern data with the receive clock signal is found. Once the training-pattern data is de-skewed, control passes to block 270 to perform falling edge de-skew.

Because of different rise and fall delays in the individual data lines 20, the falling edges of the data waveform may not be properly aligned with the edges of the receive clock signal. To correct this problem, the data waveform is sent into the falling edge DAC 48 in block 270, and the de-skew logic 44 tests the value of the receive registers 50 in the same way as for delay DAC 46. The de-skew logic 44 implements the same binary search method as above to align the falling edges of the data waveform with the edges of the receive clock signal (as indicated at 272, 273, and 274). During block 270, the rising edges of the data waveform are unaffected and remain aligned with the edges of the clock signal 30.

Once the falling edges of the data waveform are properly de-skewed, control passes to block 290. At block 290, the switch Sw1 40 is switched to the receive signal clock path 38, thus adding a delay of T/2 so that data is captured properly during receive operations (as is illustrated by the arrows in FIGS. 9A and 9B). The process ends at block 300.

An alternate implementation of the above may reference the delay locked loop 34 of the tuning circuit 28 to a local receive-side half-bit-rate clock (having the same frequency as the receive clock) during idle (i.e., time de-skewing) periods, and would switch the delay locked loop 34 to lock to the clock signal 30 for normal receive operations. In this alternate implementation, a delay would be added before the start of a normal receive mode to allow the delay locked loop 34 to settle before data is received.

The time de-skewing circuitry according to the present invention operates on a simple binary training pattern that can be generated in SCSI without major protocol changes. As illustrated by the foregoing, the time de-skewing operations are contained within the receiver circuitry and do not require feedback to the transmitter. Moreover, the method and apparatus of the present invention will operate with either coincident transmit clock and data edges as described, or with transmit clock edges centered in the transmit data cells by inverting the selection of 'deskew/receive' switch 40. Additionally, the delay cells are locked to an accurate clock, thus ensuing timing de-skew adjustment stability over changes in power supply and temperature. Finally, the timing de-skew scheme of the present invention is primarily digital, therefore, it can be implemented on an all-digital integrated circuit process, and is relatively insensitive to analog matching and linearity issues.

As described above, the apparatus of the present invention can correct for time skew errors up to T. If larger timing skews need to be accommodated, a lower frequency (i.e. 11001100) synchronization pattern could be added to the end of the training pattern to correctly identify the odd and even data bits.

While the invention has been described with reference to certain illustrated embodiments, the words which have been used herein are words of description, rather than words of limitation. Changes may be made, within the purview of the appended claims, without departing from the scope and spirit of the invention in its apects. Although the invention has been described herein with reference to particular structures, acts, and materials, the invention is not to be limited to the particulars disclosed, but rather extends to all equivalent structures, acts, and materials, such as are within the scope of the appended claims.

What is claimed is:

1. An apparatus for detecting and correcting the timing skew of a data signal in a parallel data transmission system, comprising:
   a data path for adjusting the timing skew of the data signal with respect to a clock signal, said data path including:
   a delay digital-to-analog converter (DAC), a falling edge DAC, at least two receive registers, an output multiplexer, and control logic;
   a clock path for correcting the duty-cycle of a receive clock and for delaying said receive clock in normal receive operations, wherein said clock path is selectably switchable between a timing skew correction mode and a receive-data mode;
   a local accurate tuning system for generating a timing signal to tune all of the delay elements of said parallel data transmission system according to a bit-cell time of the data signal;
   wherein said control logic detects the timing skew of the data signal and controls said delay DAC and said falling edge DAC to provide appropriate delay to the data signal in accordance with the detected timing skew of said data signal.

2. The apparatus of claim 1, wherein said apparatus is implemented on a receive-side of said parallel data transmission system and operates substantially without control of a transmission side of said parallel data transmission system.

3. The apparatus of claim 1, wherein said local accurate tuning system comprises a local accurate clock and a delay-locked loop.

4. The apparatus of claim 1, wherein said local accurate tuning system generates a direct current (DC) tuning signal.

5. The apparatus of claim 3, wherein said delay-locked loop is locked to a frequency of said local accurate clock to produce said tuning signal.

6. The apparatus of claim 1, wherein said delay DAC delays the data signal according to said tuning signal and instructions from said control logic.

7. The apparatus of claim 6, wherein said delay DAC comprises a plurality of individual delay cells in a binary weighted arrangement such that an incremental and selectable delay is provided.

8. The apparatus of claim 1, wherein said falling edge DAC delays the falling edge of the data signal according to said tuning signal and instructions from said control logic.

9. The apparatus of claim 8, wherein said falling edge DAC comprises a plurality of individual falling-edge delay cells having at least two switchably-selected delay values, each of said plurality of falling edge cells being coupled to logic gates.

10. The apparatus of claim 1, wherein said receive registers capture data on rising and falling edges of said clock signal.

11. The apparatus of claim 1, wherein said output multiplexer swaps the outputs of said at least two receive registers according to instructions from said control logic.

12. The apparatus of claim 1, wherein said apparatus is implemented on an integrated circuit.

13. The apparatus of claim 12, wherein the integrated circuit is a digital integrated circuit.

14. An apparatus for detecting and correcting the timing skew of data in a parallel data transmission system having a receive clock and at least one data signal with a bit-cell time, the apparatus comprising:
a local accurate tuning system configured to generate a tuning signal according to the bit-cell time;
a clock path configured to correct the duty-cycle of the receive clock according to said tuning signal and said bit-cell time, wherein said clock path is selectably switchable between a timing skew correction mode and a receive-data mode;
a data path in parallel with said clock path comprising: a delay digital-to-analog converter (DAC), a falling edge DAC, at least two receive registers, an output multiplexer, and control logic;
said control logic detecting the timing skew of said at least one data signal and controlling said delay DAC and said falling edge DAC to provide appropriate delay to said data signal in accordance with the detected timing skew of said data signal with respect to said clock signal;
said delay DAC delaying said at least one data signal according to said tuning signal and instructions from said control logic;
said falling-edge DAC delaying the falling edges of said at least one data signal according to said tuning signal and instructions from said control logic;
said receive registers capturing data on both the rising and falling edges of said clock signal;
said output multiplexer swapping the outputs of said at least two receive registers according to instructions from said control logic.

15. The apparatus of claim 14, wherein said local accurate tuning system comprises a local accurate clock and a delay-locked loop.

16. The apparatus of claim 15, wherein said tuning signal is a direct current (DC) signal.

17. The apparatus of claim 15, wherein said delay-locked loop is locked to a frequency of said local accurate clock to produce said tuning signal.

18. The apparatus of claim 14, wherein said clock path comprises a de-skew path, a receive-data path, and a duty-cycle correction circuit, the de-skew path configured to pass a clock signal from the receive clock with no delay;
the receive-data path configured to insert a delay of one-half of said bit-cell time into said clock signal;
the duty-cycle correction circuit configured to correct the duty-cycle of the receive clock to 50 percent.

19. The apparatus of claim 18, wherein said delay DAC is a variable delay circuit comprising a binary weighted arrangement of individual delay cells, each delay cell having a fixed delay period related to said bit-cell time.

20. The apparatus of claim 19, wherein the delay cells of said delay DAC provide an incremental and selectable delay.

21. The apparatus of claim 20, wherein said delay cells representing the least significant bits of said delay DAC are divided into two branches to provide said incremental and selectable delay.

22. The apparatus of claim 21, wherein the delay cells of said delay DAC are implemented as an inverter stage with transistor-implemented controlled current sources.

23. The apparatus of claim 22, wherein the current sources of said delay cells are controlled in accordance with said tuning signal.

24. The apparatus of claim 14, wherein said falling-edge DAC comprises a multistage variable delay circuit.

25. The apparatus of claim 14, wherein each stage of said falling-edge DAC comprises a falling-edge delay cell having at least two switchably-selected delay values coupled to logic gates.

26. The apparatus of claim 14, wherein said receive registers each comprise a D-type flip-flop.

27. The apparatus of claim 26, wherein the swapping action of said output multiplexer provides an overall de-skew time range of at least twice of said bit-cell time.

28. The apparatus of claim 14, wherein said control logic performs a binary search function, comparing the timing of said at least one stream of data with said clock signal.

29. The apparatus of claim 14, wherein the apparatus provides at least a total de-skew time range of twice of said bit-cell time with a resolution of at least six bits.

30. The apparatus of claim 14, wherein the apparatus is implemented on a digital integrated circuit.

31. A method for detecting and correcting the timing skew of data in a parallel data transmission system having a receive clock and at least one data signal with a bit-cell time, the method comprising:
generating a tuning signal having an amplitude based on a local accurate clock;
correcting the duty-cycle of the receive clock according to said tuning signal and the bit-cell time;
determining the time delay of said at least one data signal relative to the receive clock and said tuning signal;
adjusting the time delay of said at least one data signal relative to the receive clock;
adjusting the time delay of falling edges of said at least one data signal relative to said receive clock;
capturing data from said at least one data signal on the rising and falling edges of said receive clock; and
swapping the outputs of at least two receive registers used in said capturing if the detected time-skew of said at least one data signal reaches a predetermined level.

32. The method of claim 31, wherein a delay digital-to-analog converter (DAC) used in said adjusting comprises five delay cells in a binary weighted arrangement.

33. The method of claim 32, wherein the least significant bit delay cells of said delay DAC are divided into two branches to provide an incremental and selectable delay.

34. The method of claim 33, wherein said delay cells are implemented as an inverter stage with transistor-implemented controlled current sources.

35. The method of claim 34, wherein the current sources of said delay cells are controlled in accordance with said tuning signal.

36. The method of claim 31, wherein a falling edge DAC used in said adjusting of falling edges comprises a three-stage variable delay circuit.

37. The method of claim 36, wherein each stage of said falling edge DAC comprises a falling-edge delay cell having at least two switchably-selected delay values.

38. The method of claim 31, wherein said receive registers each comprise a D-type flip-flop.

39. The method of claim 31, wherein said swapping operation provides at least a total de-skew time range of twice of said bit-cell time with a resolution of at least six bits.

40. An apparatus implemented on an integrated circuit for detecting and correcting the timing skew of at least one data signal in a parallel data transmission system, comprising:

a local accurate tuning system for generating a direct current (DC) tuning signal according to a bit-cell time of said parallel data transmission system;

a clock path for adjusting the timing and duty-cycle of a receive clock according to said DC tuning signal and said bit-cell time, wherein said clock path is selectably switchable between a timing skew correction mode and a receive-data mode;

a data path positioned in parallel with said clock path comprising:

a delay digital-to-analog converter (DAC), a falling edge DAC, at least two receive registers, an output multiplexer, and control logic;

said control logic detecting the timing skew of at least one data signal and controlling said delay DAC and said falling edge DAC to provide appropriate delay to said data signal in accordance with the detected timing skew of said data signal with respect to said receive clock;

wherein said apparatus is implemented on the receive-side of said parallel data transmission system and operates substantially without control of the transmission side of said parallel data transmission system.

41. The apparatus of claim 40, wherein said delay DAC delays said at least one data signal according to said tuning signal and instructions from said control logic.

42. The apparatus of claim 40, wherein said falling edge DAC delays said at least one falling edge of at least one data signal according to said tuning signal and instructions from said control logic.

43. The apparatus of claim 40, wherein said receive registers capture data on both the rising and falling edges of said clock signal.

44. The apparatus of claim 40, wherein said output multiplexer swaps the outputs of said at least two receive registers according to instructions from said control logic.

45. The apparatus of claim 40, wherein the integrated circuit is a digital integrated circuit.

* * * * *